United States Patent [19]
Kobayashi

[11] Patent Number: 5,341,825
[45] Date of Patent: Aug. 30, 1994

[54] LIQUID OVERFLOW TANK COMBINED WITH PARTITION ISOLATING TWO CHAMBERS

[75] Inventor: Satoshi Kobayashi, Tokyo, Japan

[73] Assignee: Nippon Steel Corporation, Tokyo, Japan

[21] Appl. No.: 71,224

[22] Filed: Jun. 2, 1993

Related U.S. Application Data

[63] Continuation of Ser. No. 776,070, Oct. 16, 1991, abandoned.

[30] Foreign Application Priority Data

Oct. 16, 1990 [JP] Japan .................................. 2-275314

[51] Int. Cl.⁵ .................................. B08B 3/04
[52] U.S. Cl. .................................. 134/61; 134/114; 134/182; 134/902; 137/574
[58] Field of Search .................. 134/902, 61, 66, 73, 134/114, 155, 182, 186; 68/5 E; 99/361, 362, 403, 416; 137/574, 576; 354/322, 324, 326; 118/404

[56] References Cited

U.S. PATENT DOCUMENTS

| | | | |
|---|---|---|---|
| 3,987,816 | 10/1976 | Lange | 137/574 X |
| 3,990,392 | 11/1976 | Andre | 118/404 |
| 4,090,530 | 5/1978 | Lange | 137/574 X |
| 4,092,176 | 5/1978 | Kozai et al. | 134/902 X |
| 4,354,521 | 10/1982 | Harde | 137/574 X |
| 4,736,758 | 4/1988 | Kusuhara | 134/114 X |

FOREIGN PATENT DOCUMENTS 57624 3/1989 Japan .................................. 134/902

*Primary Examiner*—Philip R. Coe
*Attorney, Agent, or Firm*—Cushman, Darby & Cushman

[57] ABSTRACT

An overflow tank for rinsing an article such as a wafer with a liquid such as pure water is continuously supplied with the liquid. The tank comprises a partition isolating two adjacent chambers from each other, and is utilized as a passage for transferring an article from one of the chambers to the other chamber. The overflow tank has two opening sections that are opened at the two chambers, respectively, and each of the opening sections is defined by a continuous and level peripheral edge so that an overflow of the liquid can occur over all of the peripheral edge. During the passage of the article through the overflow tank, the article is rinsed with the water.

7 Claims, 6 Drawing Sheets

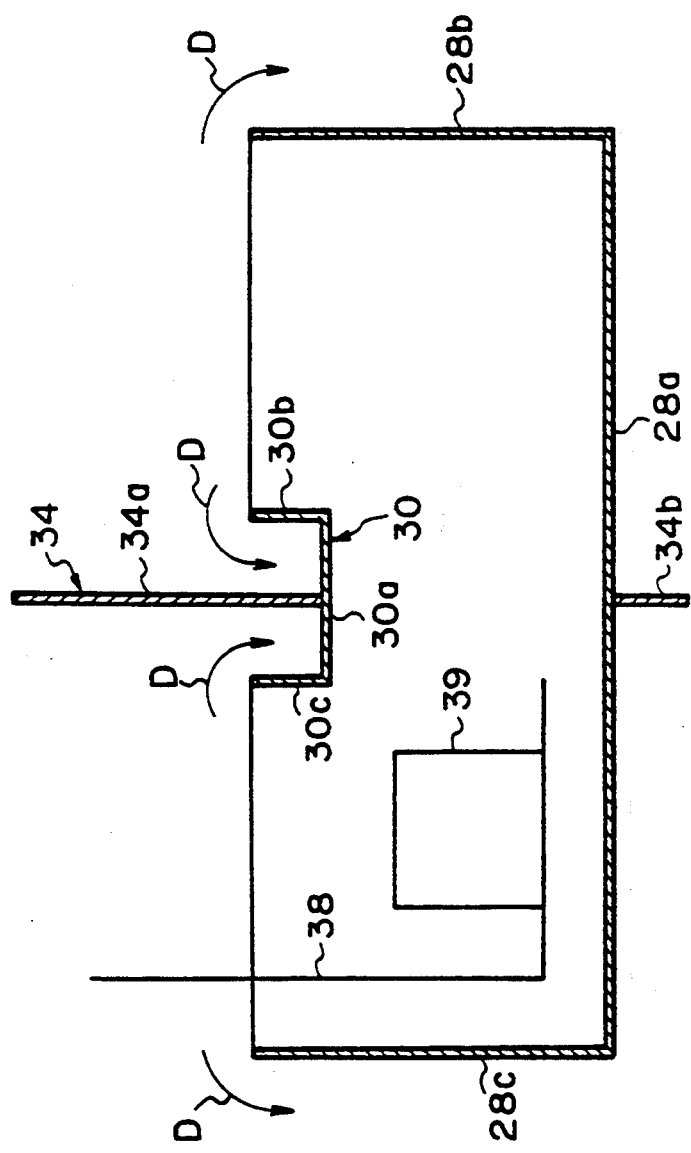

LIQUID OVERFLOW TANK COMBINED WITH PARTITION ISOLATING TWO CHAMBERS

This is a continuation of application Ser. No. 07/776,070, filed on Oct. 16, 1991, which was abandoned upon the filing hereof.

BACKGROUND OF THE INVENTION

1) Field of the Invention

The present invention refers to an overflow tank continuously supplied with a liquid such as pure water including a partition isolating two adjacent chambers from each other, and is utilized as a passage for transferring an article from one of the two chambers to the other chamber. Such an overflow tank may be advantageously used to rinse a silicon wafer with pure water in a wafer fabrication process in which a plurality of integrated circuits is formed over a surface of the silicon wafer.

2) Description of the Related Art

As is well known, the wafer fabrication process involves steps of: washing the wafers with a solution based upon alkali, a solution based upon acid, and an organic solution for removing organic material dust and metal dust therefrom; and rinsing the wafers with a liquid such as pure water after washing the wafers with each of the solutions. For example, the washing and rinsing steps are carried out before an oxide layer formation process and after a photoetching process. Of course, the organic material dust and metal dust must be removed from the wafers because they cause defects such as short circuits, and circuit breakages in the integrated circuits formed over the wafer surface.

The washing and rinsing steps must be carried out in a closed washing space so that the wafers can be protected from dust in the atmosphere. Also, when the wafer is washed in the closed washing space with at least two different solutions, the closed washing space must be divided by a partition into two washing chambers that are isolated from each other thereby, and in which the respective different solutions are independently used. This is because it is necessary to prevent a chemical reaction between the vapors of the different solutions. For example, when the different solutions comprise an alkali-based solution and an acid-based solution, respectively, and when the wafer is washed in a commom closed washing space with said solutions, vapors from the alkali-based and acid-based solutions easily mix to produce a salt by the chemical reaction therebetween, and thus the wafers may be polluted by the salt. Thus, when the wafer is washed with different solutions, the closed space must be divided into separate washing chambers so that independent washing of the wafer with the different solutions can be carried out.

Note, the solutions are frequently heated to enhance a washing effect thereof. For example, the washing temperature of an NH$_4$OH solution, an HCl solution, or the like is about 80° C., and the washing temperature of an H$_2$SO$_4$ solution or the like and the organic solution such as a dichlorobenzene solution is about 120° C. The heated solutions generate large quantities of vapor thereby emphasizing the need for isolated chambers.

Conventionally, a movable partition is used to divide the closed washing space into separate washing chambers because it is necessary to transfer the wafers from one of the washing chambers to another washing chamber. Namely, the partition is moved between a closed position in which the washing chambers are isolated from each other and an opened position so that the washing chambers are in communication with each other for transferring the wafers. The use of the movable partition results in a large and expensive wafer washing installation because a drive mechanism is necessary to operate the movable partition. Also, when the partition is opened, the vapors inevitably mix with each other.

Thus, it has been suggested that an overflow tank for rinsing the wafers with a liquid such as pure water be utilized as a passage for transferring the wafers from one of the washing chambers to another washing chamber. In particular, the overflow tank is combined with a fixed partition in such a manner that the wafers can be transferred from one of the washing chambers to the other washing chamber through the overflow tank. With this arrangement, a wafer washing installation can be smaller because no drive mechanism is necessary for the partition, and the adjacent washing chambers are always isolated from each other. Nevertheless, the conventional arrangement, in which the overflow tank is utilized as the passage for transferring the wafers, involves drawbacks which should be further eliminated for the reasons as discussed hereinafter in detail.

On the other hand, a production of a liquid crystal display, in which a fine electrode pattern is formed over a display substrate by a photoetching process, involves the same problem as mentioned above.

SUMMARY OF THE INVENTION

Therefore, an object of the present invention is to provide an improved overflow tank for rinsing an article such as a wafer with a liquid such as pure water that is combined with a partition isolating two adjacent chambers from each other, and is utilized as a passage for transferring the article from one of the chambers to the other chamber.

In accordance with the present invention, there is provided an overflow tank for rinsing an article with a liquid and is continuously supplied with the liquid. The overflow tank comprising: a partition isolating two adjacent chambers from each other; and a tank body having two opening sections and incorporated in the partition member in such a manner that the opening sections are opened at the two chambers, respectively, whereby the article can be transferred from one of the chambers to the other chamber through the tank body as it is rinsed with the liquid. Each of the two opening sections being defined by a flush peripheral edge so that an overflow of the liquid can occur over all of the peripheral edges.

According to another aspect of the present invention, there is provided an overflow tank for rinsing an article such as a wafer with liquid such as pure water in a closed washing space in which the article is washed with at least two different solutions. The overflow tank comprising: a tank body having an upper peripheral edge positioned at the same horizontal plane to define an upper opening thereof; a groove formation member bridging across the upper opening of the tank body to divide it into first and second opening sections and having a bottom wall portion disposed at a level lower than that of the upper peripheral edge of the tank body, and opposed side wall portions extended upward from and along the side edges of the bottom wall portion, the bottom wall portion and opposed side wall portions of the groove formation member defining a groove opened at ends thereof, each of the opposed side wall portions of the groove formation member having an upper edge positioned flush with the upper peripheral edge of the tank body and partially defining the corresponding first or second opening sections; and a partition member combined with the tank body and the groove formation member and dividing the closed washing space into first and second washing chambers in which the article is washed with the respective different solutions, the tank body being utilized as a passage for transferring the article from the first washing chamber to the second washing chamber, at least a portion of the partition member being extended along the groove of the groove formation member and in contact with an upper surface of the bottom wall portion thereof, the tank body being continuously supplied with the liquid, whereby an overflow of the liquid can occur over the peripheral edges defining the first and second opening sections without stagnating the liquid at any locations thereof, while the article is rinsed with the liquid during the transferring of the article from the first washing chamber to the second washing chamber through the overflow tank.

BRIEF DESCRIPTION OF THE DRAWINGS

The other objects and advantages of the present invention will be better understood from the following description, with reference to the accompanying drawings, in which:

FIG. 9 is a longitudinal cross-sectional view of the overflow tank of FIG. 8.

DESCRIPTION OF THE PREFERRED EMBODIMENTS

First, for a better understanding of the present invention, prior arts are explained with reference to FIGS. 1 to 7.

Figure 1:
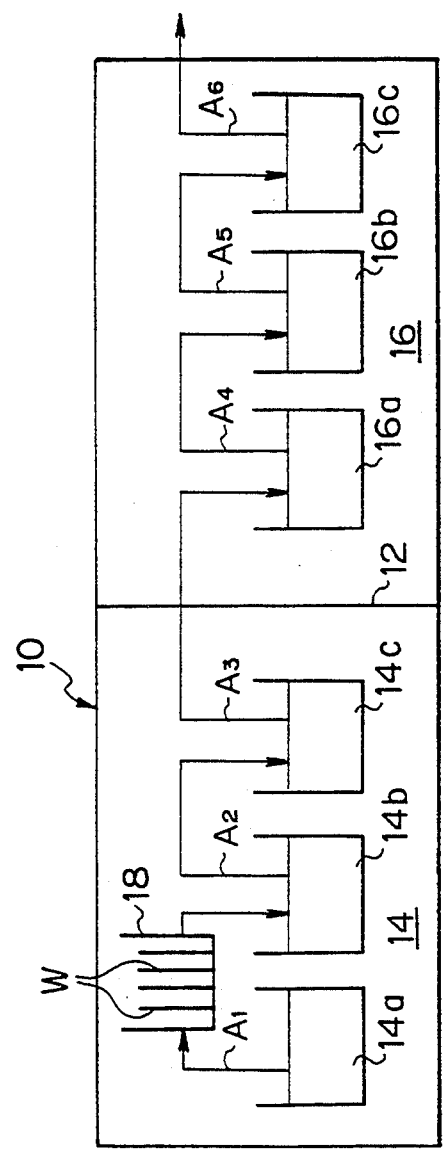
FIG. 1 is a schematic view showing a conventional wafer washing installation.

FIG. 1 schematically shows a conventional wafer washing installation by way of example. This wafer washing installation comprises a housing 10 for defining a closed space therein. The closed space or interior space of the housing 10 is divided by a movable partition 12 into two washing chambers 14 and 16. In the first washing chamber 14, a washing tank 14a and two water tanks 14b and 14c are disposed, and in the second washing chamber 16, a washing tank 16a and two water tanks 16b and 16c are disposed. The washing tanks 14a and 16a are filled with, for example, an alkali solution such as $NH_4OH+H_2O_2+H_2O$ and an acid solution such as $HCl+H_2O_2+H_2O$, respectively, solutions of which are heated up to a temperature of about 80° C., so that the washing chambers 14 and 16 are permeated with alkali and acid vapors generated from the alkali and acid solutions, respectively. The water tanks 14b, 14c and 16b, 16c are filled with pure water. The movable partition 12 is moved by a suitable drive mechanism (not shown) between a closed position (FIG. 1) in which the washing chambers are isolated from each other and an opened position (not shown) so that the washing chambers 14 and 16 are in communication with each other.

In FIG. 1, reference numeral 18 indicates a carrier for receiving some silicon wafers W, supported and moved by a well-known transfer machine (not shown), as indicated by arrows $A_1$, $A_2$, $A_3$, $A_4$, $A_5$, and $A_6$. In particular, the carrier 18 is first immersed in the alkali solution held by the washing tank 14a, so that the wafers W are washed with the alkali solution, and is then moved from the washing tank 14a to the water tank 14b, as indicated by the arrow $A_1$, so that the wafers W are rinsed with the pure water. Successively, the carrier 18 is moved from the water tank 14b to the water tank 14c, as indicated by the arrow $A_2$, so that the wafers W are further rinsed with the pure water. When the rinsing of the wafers W with the pure water held by the water tank 14c is completed, the partition 12 is moved from the closed position to the opened position. Thus, the carrier 18 with the wafers W can be transferred from the first washing chamber 14 to the second washing chamber, and can then be immersed in the acid solution held by the washing tank 16a, as indicated by the arrow $A_4$. After the washing of the wafers W with the acid solution is completed, the carrier 18 is successively moved as indicated by the arrows $A_4$ and $A_5$, so that the wafers W are rinsed with the pure water held by the water tanks 16b and 16c. Thereafter, the carrier 18 with the wafers W is transferred from the second washing chamber 16 to another processing station (not shown), as indicated by the arrow $A_6$.

As mentioned above, this conventional installation is relatively large and expensive because of the movable partition 18. Also, when the movable partition 18 is opened, the alkali and acid vapors inevitably mix with each other, and a salt is produced by the chemical reaction therebetween.

Figure 2:
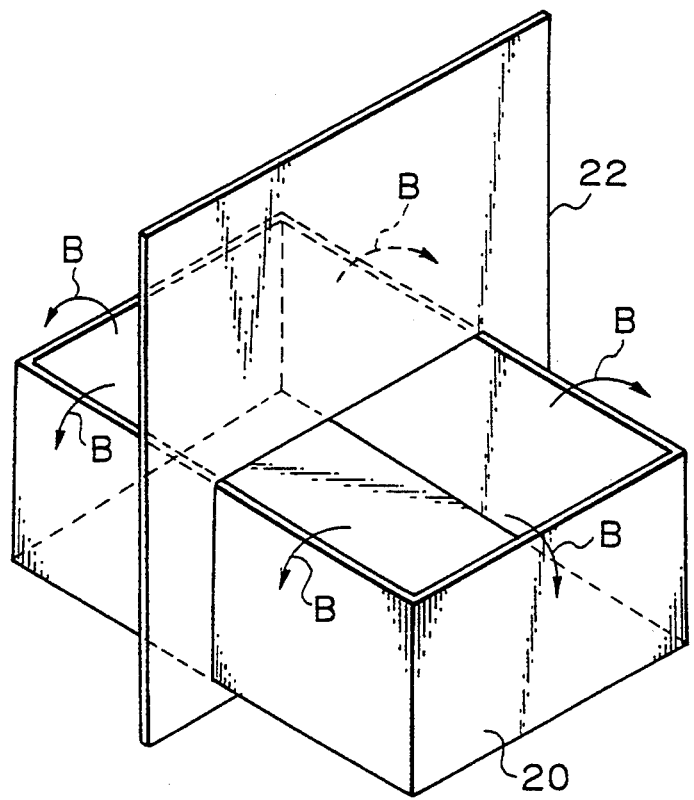
FIG. 2 is a schematic perspective view showing a conventional overflow tank for rinsing wafers, and combined with a partition.

To overcome the problems involved in the above-mentioned installation, it has been suggested that an overflow tank for rinsing the wafers with the pure water is utilized as a passage for transferring the wafers from one of the washing chambers to another washing chamber. With reference to FIG. 2, such an overflow tank is indicated by reference numeral 20. This overflow tank 20 is combined with a fixed partition 22 disposed at a boundary between the adjacent washing chambers in such a manner that the overflow tank 20 is fitted in an opening formed in the partition 22, and is continuously supplied with pure water so that the pure water overflows from an upper opening edge of the overflow tank 20, as indicated by arrows B. With this arrangement, the adjacent washing chambers are always isolated from each other because of the overflow of the pure water.

Figure 3:
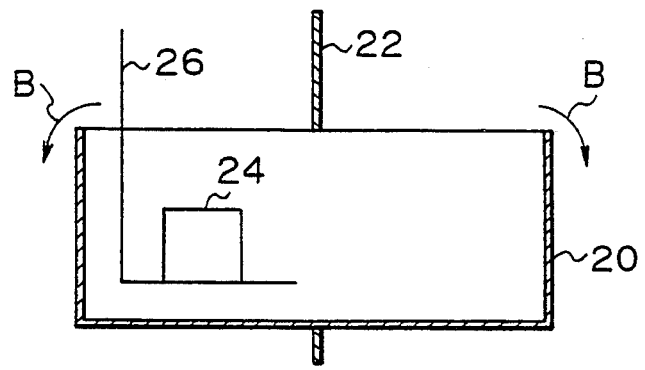
FIG. 3 is a longitudinal cross-sectional view of the overflow tank of FIG. 2, showing a wafer carrier at a position in which it is initially immersed in pure water held by the overflow tank.
Figure 4:
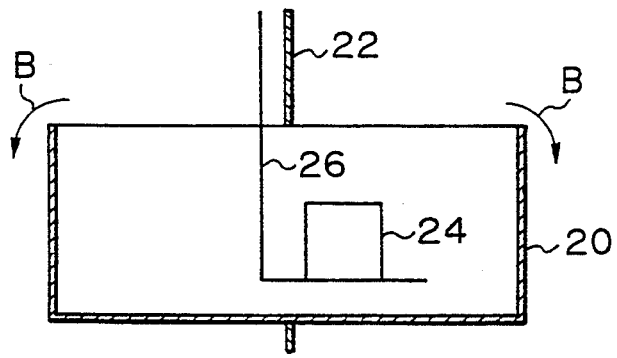
FIG. 4 is a view similar to FIG. 3, showing the transfer member at a position different from that of FIG. 3
Figure 5:
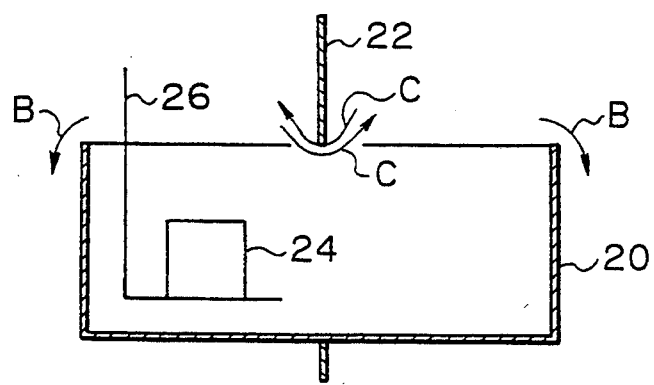
FIG. 5 is a view similar to FIG. 3, explaining how solution vapor communication occurs between adjacent washing chamber divided by a partition.

With reference to FIGS. 3 and 4, a wafer carrier is indicated by reference numeral 24, and a transfer member for supporting and moving the wafer carrier 24 is indicated by reference numeral 26. As is apparent from these drawings, the transfer member 26 with the wafer carrier 24 is immersed in the pure water at one side of the partition 22 (FIG. 3), and is then moved to the other side thereof (FIG. 4). Thereafter, the wafer carrier 24 is caught and lifted by another transfer member (not shown). Thus, the transferring of the wafers from one of the washing chambers to the other washing chamber should be carried out in such a manner that these washing chambers are isolated from each other. Nevertheless, the isolation between the adjacent washing chambers may be broken because a water surface level of the pure water held by the overflow tank 20 is lowered when the wafer carrier 24 is lifted from the overflow tank 20, and thus the adjacent washing chambers are in vapor communication with each other, as indicated by arrows C shown in FIG. 5.

Figure 6:
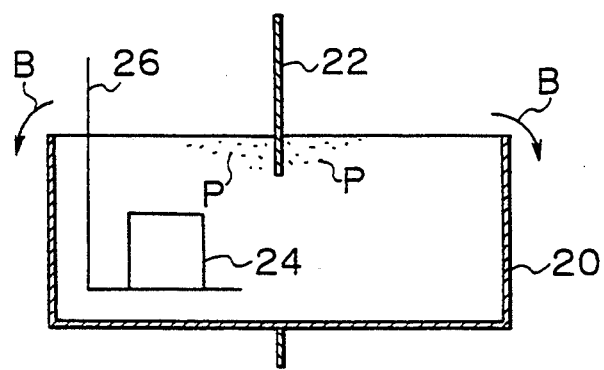
FIG. 6 is a view corresponding to FIG. 3, showing another conventional overflow tank for rinsing wafers, and combined with a partition.
Figure 7:
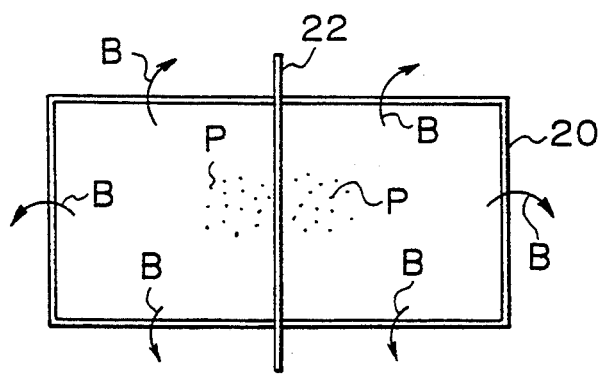
FIG. 7 is a plane view of the overflow tank of FIG. 6.

To prevent the vapor communication between the adjacent washing chambers, it has been suggested that a portion of the partition 22, which lies across the opening of the overflow tank 20, be extended downward, as shown in FIG. 6. With this arrangement, although the water surface level of the overflow tank 20 is lowered when the wafer carrier 24 is lifted from the overflow tank 20, vapor communication between the adjacent washing chambers cannot occur. However, the extended portion of the partition 22 causes another problem which should be overcome. In particular, the water held by the overflow tank 20 can stagnate at central zones that are in the vicinity of both sides of the partition 22, and thus the pollutant substances P removed from the wafers during the rinsing thereof can gather at the stagnant zones, as symbolically shown in FIGS. 6 and 7. Of course, the pollutant substances P should be discharged with the overflow of the water from the overflow tank 20.

Figure 8:
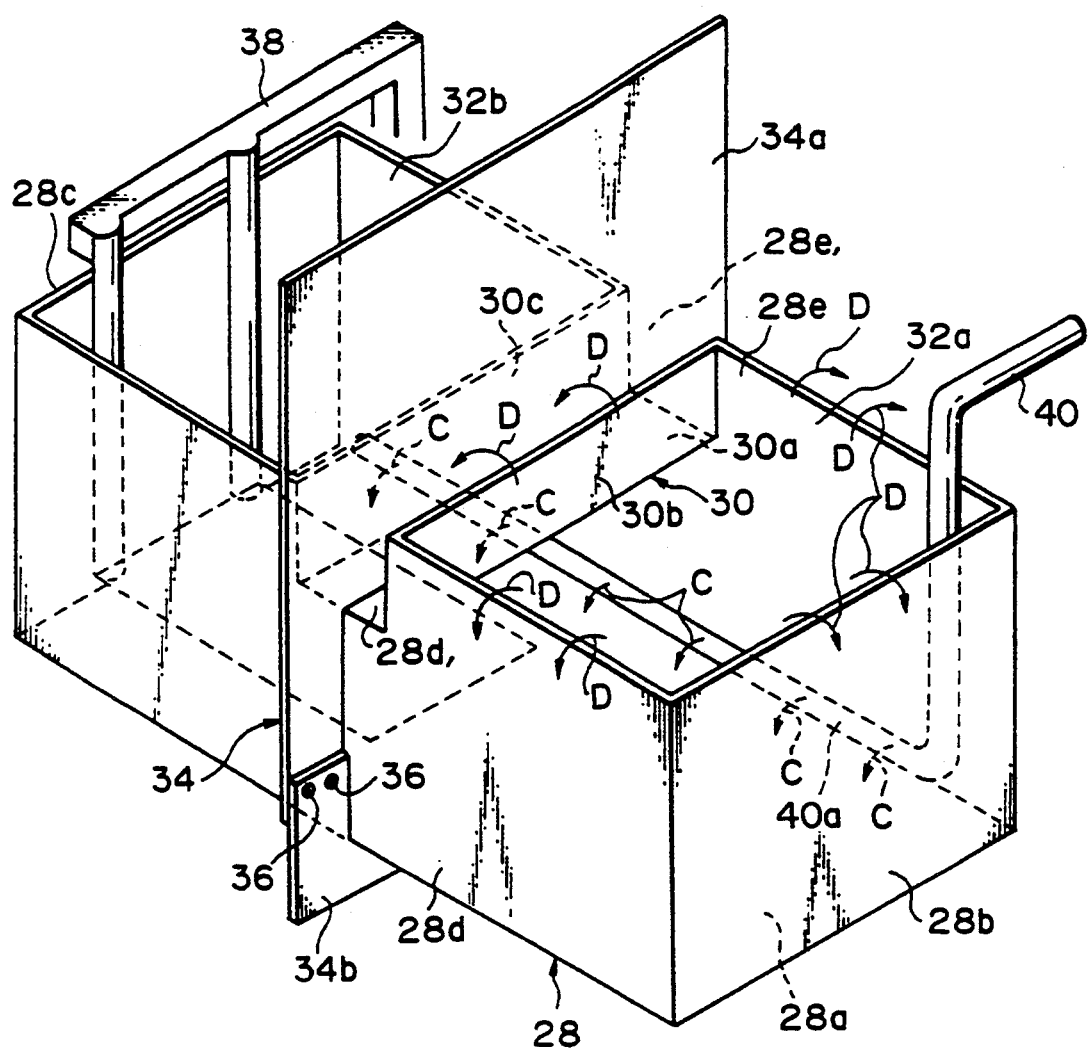
FIG. 8 is a schematic perspective view showing an overflow tank arranged according to the present invention, for rinsing wafers, combined with a partition.

FIGS. 8 and 9 show an embodiment of an overflow tank according to the present invention. This overflow tank comprises a box-like tank body 28 including a rectangular bottom wall 28a, and two pairs of opposed side walls 28b; 28c and 28d; 28e extended upward from the two opposed side edges of the bottom wall 28a, as shown in FIG. 8. Upper edges of the side walls 28b, 28c, 28d, and 28e are positioned on the same horizontal plane and cooperate with each other to form a single rectangular peripheral edge by which an upper opening of the tank body 28 is defined. Preferably, the tank body 28 is integrally formed of a suitable material exhibiting corrosion-resistance, such as stainless steel, FRP (fiber reinforced plastic), or the like. The overflow tank further comprises a groove formation member 30 provided between the opposed side walls 28d and 28e at a middle location thereof and preferably formed of the same material as the tank body 28. The groove formation member 30 includes a bottom wall 30a bridging the opposed side walls 28d and 28e and disposed at a level lower than that of the upper edges of the side walls 28b, 28c, 28d, and 28e, and opposed side walls 30b and 30c extending upward from the side edges of the bottom wall 30a between the opposed side walls 28d and 28e and having upper edges that are flush with the upper edges of the side walls 28b, 28c, 28d, and 28e. Thus, the upper opening of the tank body 28 is divided into two opening sections 32a and 32b by the groove formation member 30. As shown in FIG. 8, a groove of the groove formation member 30, which is defined by the bottom wall 30a and the side wall 30b and 30c, is opened at the ends thereof by forming U-shaped notches $28d_1$ and $28e_1$ at the opposed side walls 28d and 28e, respectively.

The overflow tank is combined with a partition member 34 including an upper partition part 34a and a lower partition part 34b. As is apparent from FIG. 8, the upper and lower partition parts 34a and 34b have a generally U-shaped configuration, and thus are connected by screws 36 to each other so as to form a rectangular opening therebetween, in which the overflow tank can be fitted and received at the location at which the groove formation member 30 is provided. Thus, the upper partition part 34a is partially extended along the groove defined by the bottom wall 30a and side walls 30b and 30c of the groove formation member 30, and is in contact with an upper surface of the bottom wall 30a thereof. Also, the upper partition part 30a is partially in contact with outer surfaces of the opposed side walls 28d and 28e. Furthermore, the lower portion part 34b is transversely in contact with a lower surface of the bottom wall 28a and is partially in contact with the outer surfaces of the opposed side walls 28d and 28e. Although the partition member 34 is shown as being small for the convenience of illustration, in actual fact it is wide enough so that a closed washing space defined by a housing (not shown) can be divided into washing chambers. Note, the upper and lower partition parts 34a and 34b may be formed of a stainless steel, a synthetic resin or the like.

In FIG. 8, reference numeral 40 indicates a duct for continuously supplying the overflow tank with pure water. The duct 39 is provided with a duct section 40a laying on the bottom of the overflow tank and having perforations (not shown) formed therein, through which the pure water is discharged from the duct section 40a, as indicated by arrows C. Thus, the pure water overflows from the opening sections 32a and 32b, as indicated by arrows D in FIGS. 8 and 9. Also, reference numeral 38 indicates a transfer member for supporting and moving a wafer carrier 39 (FIG. 9) in which some silicon wafers are received. The transfer member 38 is moved by a drive mechanism (not shown) to transfer the wafer carrier 39 from the washing chamber in which the opening section 32b is disposed to the washing chamber in which the opening section 32a is disposed.

In operation, the transfer member 38 with the wafer carrier 39 is immersed in the pure water of the overflow tank through the opening section 32b, as shown in FIG. 9, and is then moved to a position just below the opening sections 32a. Thereafter, the wafer carrier 39 is caught and lifted by another transfer member (not shown) through the opening sections 32a. Namely, similar to the conventional overflow tank as mentioned above, the overflow tank according to the present invention can also be utilized as a passage for transferring the wafers from one of the washing chambers to the other washing chamber. Of course, during the passage of the wafer carrier 39 through the overflow tank, the wafers received therein can be sufficiently rinsed with the pure water.

Although a water surface level of the pure water held by the overflow tank is lowered when the wafer carrier 39 is lifted from the overflow tank through the opening sections 32a, vapor communication between the adjacent washing chambers can be effectively prevented because the groove formation member 30 is positioned at a level lower than the water surface level of the pure water. Also, although the overflow tank may be received at the rectangular opening of the partition member 34 in such a manner that some clearance is left therebetween because of a tolerance, these clearances can be effectively sealed by water streams which are generated in and flowed out of the groove of the groove formation member 30, because of the overflow of the pure water from the upper edges of the side walls 30b and 30c. Furthermore, the clearances that may be formed between the lower partition part 34b and the bottom wall 28a of the tank body 28 can be effectively sealed by holding the water in the washing chambers at a level higher than that of the bottom wall 28a. Note, the level of the water held in the washing chambers can be controlled by adjusting the amount of the water discharged therefrom.

On the other hand, according to the present invention, the overflow of the pure water can occur all over the peripheral edges defining the opening sections 32a and 32b, respectively, because each of the side walls 30b and 30c of the groove formation member 30 has the upper edge positioned at the same level as that of the edges of the side walls 28b, 28c, 28d, and 28e of the tank body 28. Thus, the pure water cannot stagnate at any locations of the opening sections 32a and 32b. Namely, a gathering of pollutant substances as discussed with reference to FIGS. 6 and 7 cannot occur at the opening sections 32a and 32b.

Finally, it will be understood by those skilled in the art that the foregoing description is of a preferred embodiment of the disclosed overflow tank, and that various changes and modifications may be made to the present invention without departing from the spirit and scope thereof.

I claim:

1. An overflow tank continuously supplied with a liquid for rinsing an article with the liquid, said overflow tank comprising:
    a partition member isolating two adjacent chambers from each other; and
    a tank body having two opening sections and a groove section located between said two opening sections, said tank body being incorporated in said partition member in such a manner that said opening sections are opened at said two chambers, respectively, whereby the article can be transferred from one of said chambers to the other chamber through said tank body as it is rinsed with the liquid, each of said two opening sections being defined by a continuous peripheral edge which is disposed entirely in a single horizontal plane,
    said groove section being defined by a bottom wall portion and opposed sidewall portions extending from sides of said bottom wall portion, said bottom wall portion being positioned at a level lower than a level of each said peripheral edge, for causing an overflow of liquid to occur all over each said peripheral edge, thereby preventing a gathering of pollutant substance at said opening sections.

2. An overflow tank for rinsing an article such as a wafer with a liquid such as pure water in a closed washing space in which the article is washed with at least two different solutions, said overflow tank comprising:
    a tank body having an upper peripheral edge positioned entirely in a given horizontal plane to define an upper opening thereof;
    a groove formation member bridging across the upper opening of said tank body to divide it into first and second opening sections and having:
        a bottom wall portion disposed at a level lower than that of the upper peripheral edge of said tank body; and
        opposed side wall portions connected to and extending upward from the bottom wall portion, the bottom wall portion and opposed side wall portions of said groove formation member defining a groove opened at ends thereof, each of the opposed side wall portions of said groove formation member having an upper edge positioned flush with the upper peripheral edge of said tank body and partially defining the first and second opening sections; and
    a partition member combined with said tank body and said groove formation member and dividing said closed washing space into first and second washing chambers in which the article is washed with different respective solutions, said tank body being utilized as a passage for transferring the article from said first washing chamber to said second washing chamber, at least a portion of said partition member being extended along the groove of said groove formation member and in contact with an upper surface of the bottom wall portion thereof, said tank body being continuously supplied with the liquid, whereby an overflow of the liquid can occur over peripheral edges defining said first and second opening sections without stagnating the liquid at any locations thereof, while the article is rinsed with the liquid during the transferring of the article from said first washing chamber to the second washing chamber through said overflow tank.

3. An overflow tank as set forth in claim 2, wherein said first and second washing chambers are permeated with vapors resulting from the different solutions, respectively, and said groove formation member prevents vapor communication between said first and second washing chambers because of the bottom wall portion of said groove formation member being disposed at a level lower than that of the upper peripheral edge of said tank body.

4. An overflow tank as set forth in claim 3, wherein the overflow of the liquid over the opposed side wall portions of said groove formation member causes liquid streams in the groove of said groove formation member, and said liquid streams seal a clearance formed between said partition member and said groove formation member and tank body combined therewith, whereby vapor communication between said first and second washing chambers through said clearance is prevented.

5. An overflow tank as set forth in claim 2, wherein the article is washed in said first washing chamber with an alkali-based solution, and is then rinsed with the liquid by the passage of the article through said tank body, thereafter the article is washed in said second washing chamber with an acid-based solution.

6. An overflow tank as set forth in claim 2, wherein the article is washed in said first washing chamber with an acid-based solution, and is then rinsed with the liquid by the passage of the article through said tank body, thereafter the article is washed in said second washing chamber with an alkali-based solution.

7. An overflow tank comprising:
    a tank body comprising:
        a first compartment portion having a first opening;
        a second compartment portion having a second opening;

a compartment divider portion located between the first and second compartment portions, the first and second compartment portions each having a peripheral sidewall terminating at a respective continuous peripheral horizontal surface edge defining said first and second openings, respectively, each of the continuous peripheral horizontal surface edges lying entirely in a given horizontal plane, said compartment divider portion providing a horizontal wall surface positioned at a level lower than that of said peripheral horizontal surface edges; and a partition member extending vertically above and being in contact with the horizontal wall surface of said compartment divider portion, for causing tank overflow to be over all of said peripheral horizontal surface edges.

* * * * *